(12) United States Patent
Bertin et al.

(10) Patent No.: US 6,384,666 B1
(45) Date of Patent: May 7, 2002

(54) ANTIFUSE LATCH DEVICE WITH CONTROLLED CURRENT PROGRAMMING AND VARIABLE TRIP POINT

(75) Inventors: Claude L. Bertin, South Burlington; John A. Fifield, Underhill; Russell J. Houghton, Essex Junction; Nicholas M. van Heel, Burlington, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/816,030

(22) Filed: Mar. 23, 2001

(51) Int. Cl.⁷ .............................................. H01H 37/76
(52) U.S. Cl. ..................................................... 327/525
(58) Field of Search ................................ 327/525, 526, 327/199, 208; 365/96, 225.7

(56) References Cited

U.S. PATENT DOCUMENTS

| | | | |
|---|---|---|---|
| 5,194,759 A | 3/1993 | El-Ayat et al. ............... 327/525 |
| 5,272,388 A | 12/1993 | Bakker .......................... 365/96 |
| 5,471,154 A | 11/1995 | Gordon et al. ............... 327/525 |
| 5,495,181 A | 2/1996 | Kolze ............................ 327/525 |
| 5,502,395 A | 3/1996 | Allen ............................ 327/525 |
| 5,566,107 A | * 10/1996 | Gilliam ......................... 327/525 |
| 5,689,455 A | 11/1997 | Mullarkey et al. ............. 365/96 |
| 5,694,047 A | 12/1997 | Goetting et al. ............. 324/705 |
| 5,706,238 A | 1/1998 | Cutter et al. ............... 365/225.7 |
| 5,723,999 A | * 3/1998 | Merritt ......................... 327/379 |
| 5,789,970 A | * 8/1998 | Denham ........................ 327/50 |
| 5,812,477 A | 9/1998 | Casper et al. ............. 365/225.7 |
| 5,815,429 A | 9/1998 | Sher et al. ..................... 365/96 |
| 5,892,716 A | 4/1999 | Ingalls ....................... 365/225.7 |
| 5,956,282 A | 9/1999 | Casper ....................... 365/225.7 |
| 5,982,656 A | 11/1999 | Cutter et al. ................... 365/96 |
| 6,011,742 A | 1/2000 | Zheng ........................ 365/225.7 |
| 6,016,264 A | 1/2000 | Lin ............................... 365/96 |
| 6,055,173 A | 4/2000 | Mullarkey et al. ............. 365/96 |
| 6,288,598 B1 | * 9/2001 | Huang et al. ................. 327/525 |

* cited by examiner

*Primary Examiner*—Toan Tran
(74) *Attorney, Agent, or Firm*—Schmeiser, Olsen & Watts; Steven Capella

(57) ABSTRACT

A latch device is provided having a variable resistive trip point and controlled current programming. The latch device has a trip point current control element that controls an amount of current passing from a voltage source into the latch circuit, thereby varying the resistive trip point of the latch device. The latch device also has a programming current control element that controls an amount of programming current passing through the fuse element during programming. The trip point current reference and a programming current reference are provided by reference circuits having a plurality of selectable inputs that operate to change the current references binarily. An integrated circuit is also provided in which a plurality of the fuse latch devices are connected together in parallel such that the same trip point current reference and programming current reference are supplied to each latch device.

19 Claims, 9 Drawing Sheets

$T_0$ = TIME AT 0 HRS
$T_1$ = TIME AT 70 HRS
$T_2$ = TIME AT 145 HRS

ANTIFUSE LATCH DEVICE WITH CONTROLLED CURRENT PROGRAMMING AND VARIABLE TRIP POINT

FIELD OF THE INVENTION

The technical field of the invention is that of integrated circuits and, in particular, memory circuits having programmable fuse elements, particularly antifuses.

BACKGROUND OF THE INVENTION

Fuses and antifuses are used to personalize semiconductor devices to meet specific integrated circuit requirements. To personalize a semiconductor device with fuses, some of the available fuses are blown by a laser or other means to make the desired changes to the device and its associated circuits. Fuses are blown to make a previously closed connection open. Antifuses are also used to personalize semiconductor devices. Antifuses are devices that perform the opposite function of a fuse. When a sufficient voltage is applied across an antifuse structure, the structure becomes permanently shorted, and an electrical connection is made. Thus, antifuses are "open" and unconnected until they are "programmed" to provide a closed connection.

In this application, the term "fuse element" will be used to cover both fuses and antifuses, both of which can be used with the latch device and programming circuits of the present invention. The term "fuse latch" will be used to reference a latch device that can be used for both fuses and antifuses.

Antifuse structures are made by stressing an insulating medium between two conductors. Programming these structures is most reliable if current levels during programming and during use are kept under a safe level to prevent premature wear out of the fused filament. A means for limiting the programming current is therefore needed to prevent overstressing the antifuse element during programming.

It is desirable to program many antifuses in parallel to reduce test time. However, with several fuses programmed in parallel, the lowest resistance fuse tends to shunt current away from other fuses that may need the current to program successfully. Thus, a means for programming fuses in parallel with a uniform amount of programming current passing through each fuse is needed.

Related art fuse latches also lacked a means for determining if an antifuse programmed successfully, and for testing the resistance margin over what resistance value is required by the fuse latch for proper sensing. Another problem with high-trip point fuse latches in the related art is their sensitivity to electrical disturbances, which sometimes cause soft error upsets or failures of the fuse latch. A means for adjusting the resistive trip point of the fuse latch and for improving the immunity of the fuse latch to soft error failures is therefore needed, particularly after the latch is set.

SUMMARY OF THE INVENTION

A latch device is provided having a variable resistive trip point and controlled current programming. The latch device has a trip point current control element that controls an amount of current passing from a voltage source into the latch circuit, thereby varying the resistive trip point of the latch device. The trip point current control element in the disclosed embodiment is a PFET that has its gate connected to a trip point current reference and its source and drain connected between the voltage source and the latch circuit.

The latch device also has a programming current control element that controls an amount of programming current passing through the fuse element during programming. The programming current control element in the disclosed embodiment is an NFET that has its gate connected to a programming current reference and its source and drain placed in the path of the programming current.

The trip point current reference and the programming current reference are provided by reference circuits having a plurality of selectable inputs that operate to change the current references binarily. The reference circuits use current mirror technology to set the current flows through the latch device at predictable levels.

The application also discloses an integrated circuit in which a plurality of fuse latch devices are connected together in parallel such that the same trip point current reference and programming current reference are supplied to each latch device. A global trip point control circuit and a global programming current control circuit provide the trip point current reference and the programming current reference, respectively.

Generally, the present invention provides a latch device having a variable resistive trip point, comprising:
 a voltage source;
 an adjustable trip point current reference;
 a latch circuit having a fuse latch output; and
 a trip point control element, said trip point control element being operable to control the amount of current passing through said latch circuit based on said adjustable trip point current reference, thereby providing the latch device with a variable resistive trip point.

The present invention further provides a fuse element programming circuit having controlled current programming, comprising:
 a fuse element; and
 a current control device connected to said fuse element, said current control device being controlled by a programming current reference to limit an amount of programming current passing through the fuse element, the programming current reference being adjustable.

The present invention additionally provides an integrated circuit comprising:
 a global trip point control circuit that provides an adjustable trip point current reference; and
 a plurality of fuse latch devices, each fuse latch device comprising a latch circuit having a fuse latch output and a trip point control element, said trip point control elements being connected in parallel to said adjustable trip point current reference and being operable to control an amount of current passing through each of said latch circuits based on said adjustable trip point current reference.

The present invention also provides an integrated circuit comprising:
 a global programming current control circuit that provides an adjustable programming current reference; and
 a plurality of fuse latch devices, each fuse latch device comprising a fuse element and a programming current control device, said programming current control devices being connected in parallel to said adjustable programming current reference and being operable to control an amount of programming current passing through each of said fuse elements based on said adjustable programming current reference.

BRIEF DESCRIPTION OF THE DRAWINGS

The present invention will become more clearly appreciated as the disclosure of the invention is made with reference to the accompanying drawings. In the drawings.

DETAILED DESCRIPTION OF THE INVENTION

The present invention will now be described in detail with reference to FIGS. 1 to 15 of the accompanying drawings.

Figure 1:
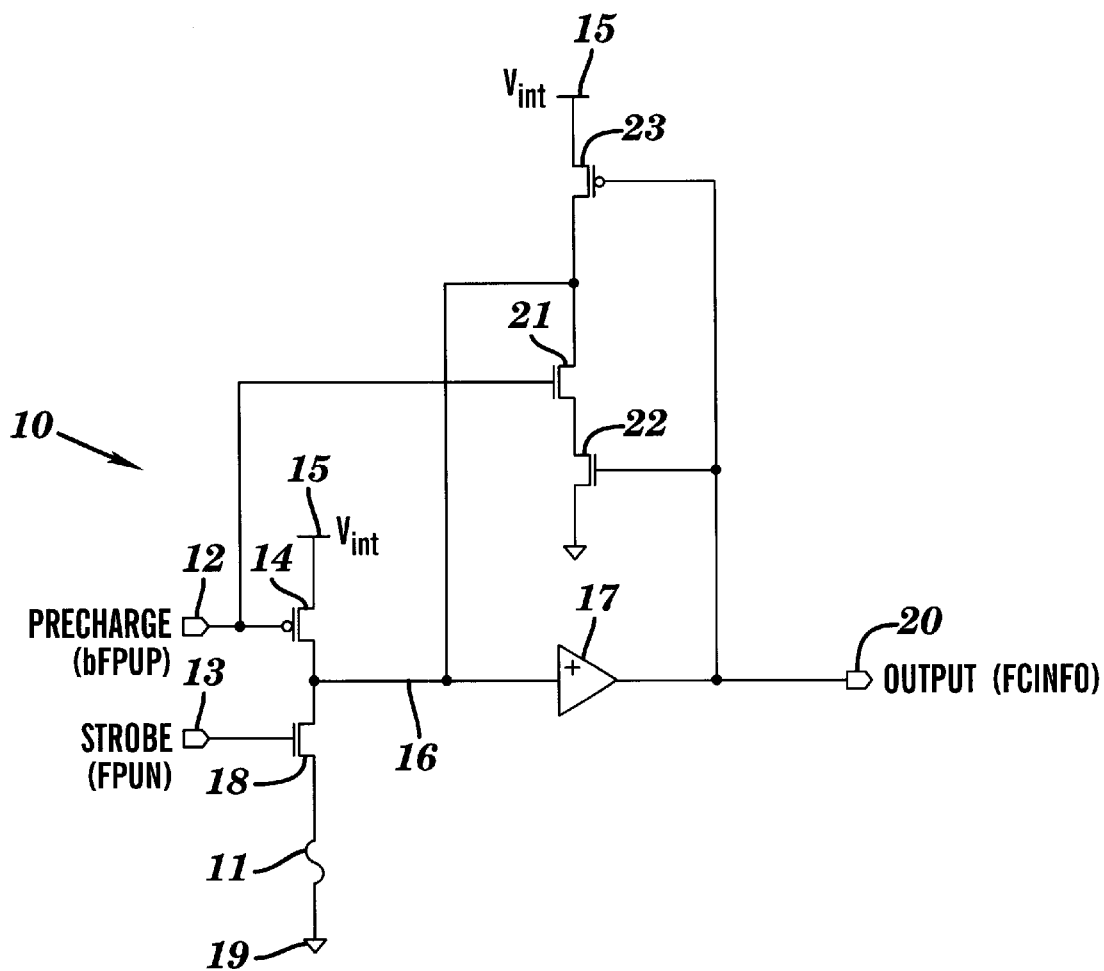
FIG. 1 is a schematic circuit diagram of a conventional fuse latch.
Figure 2:
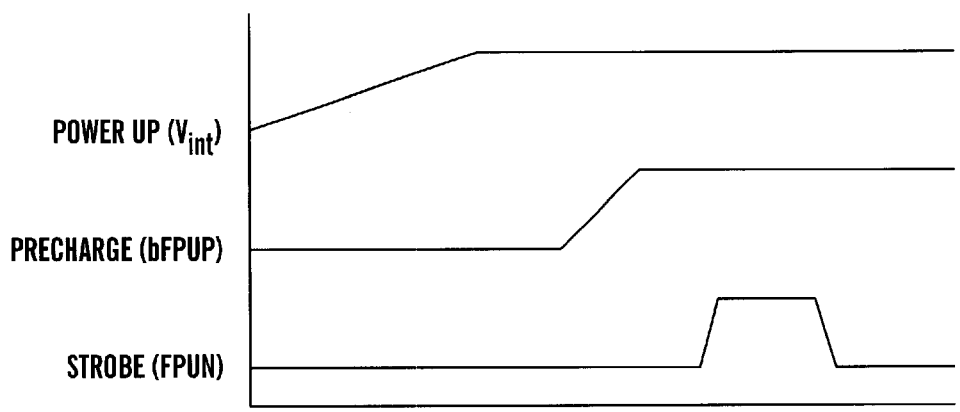
FIG. 2 is a voltage timing diagram of the inputs to the conventional fuse latch device.

FIG. 1 shows a circuit of a typical fuse latch 10 used on an integrated circuit, such as a memory product. The fuse latch 10 operates to read the state of a fuse 11 to determine if the fuse is programmed or unprogrammed. The fuse latch circuit 10 has a precharge input (bFPUP) 12 and a strobe input (FPUN) 13. The precharge input 12 is connected to a first PFET 14 and operates to gate the power supply Vint 15 down to the internal node 16 of the latch 10, which is connected to an inverter 17. The internal node 16 is precharged to a high state by a pulse from the precharge input 12, and the internal node 16 stays in the high state after the precharge input pulse is removed.

The strobe input 13 is connected to a first NFET 18 which operates to gate the internal node 16 to the fuse element 11. When a pulse is delivered to the strobe input 13, the first NFET 18 is turned on to connect the internal node 16 to the fuse element 11. If the fuse element 11 is an unprogrammed fuse (i.e., it is a short circuit), then the charge stored on the internal latch node 16 is discharged through the fuse element 11 to the ground 19. The inverter 17 then flips state and changes the output 20 of the latch 10 to reflect that the fuse element 11 is unprogrammed.

In contrast, if the fuse element 11 is a programmed fuse (i.e., it is an open circuit), then the charge stored on the internal latch node 16 is not discharged through the fuse element 11 when the first NFET 18 is turned on. The charge stored on the internal latch node 16 thus stays the same and does not cause the inverter 17 to flip state or change the output 20 of the latch 10. The latch 10 has a first logical state for a programmed fuse, and a second logical state for an unprogrammed fuse. The logical state 10 of the latch is stored by the latch circuit until the power supply Vint 15 is removed. The latch 10 has two NFETs 21, 22 and a PFET 23 that provide feedback elements for the latch 10.

The timing diagram for the fuse latch 10 described above is shown in FIG. 2. The timing sequence is that Vint comes on (i.e., power-up occurs). Then the precharge input 12, which is started low, goes high, which is its inactive state. The fuse element 11 can then be polled or interrogated by providing a positive pulse of short duration as the strobe input 13. The strobe input 13 then returns to ground.

The typical fuse latch 10 described above does not have a means for adjusting the resistive trip point of the latch in a controlled and predictable manner. The fuse latch 10 has a fixed trip point. This is significant because the amount of current that flows through the PFET 23 affects the operation of the latch circuit and is a function of process, voltage and temperature (PVT). Different values of PVT will cause the trip point of the latch circuit to be varied unintentionally, thereby causing uncertainty in the latch operation, particularly when this fuse latch 10 is used with an electrically blown fuse element, such as an antifuse. While metal fuses typically provide a very distinct short circuit or open circuit, electrically blown fuses such as antifuses do not. That is, the range of resistance change between programmed and unprogrammed states of an antifuse is not as distinct as with metal fuses.

For example, a fuse latch for an antifuse might be designed to have a 100 kOhm trip point (i.e., the latch is designed to have a different output state when a sensed fuse element 11 has less than 100 kOhm resistance than when the sensed fuse element 11 has more than 100 kOhm resistance). However, a different value of PVT might change the actual trip point to 55 kOhms. If the latch is connected to an electronic fuse element 11 having 55 kOhms in its programmed or unprogrammed state, for example, the latch cannot reliably discern the programmed state of the fuse element 11. The latch 10 also does not provide a means for margin testing or for placing the latch in an operating state that enhances the soft error immunity of the latch circuit.

Figure 3:
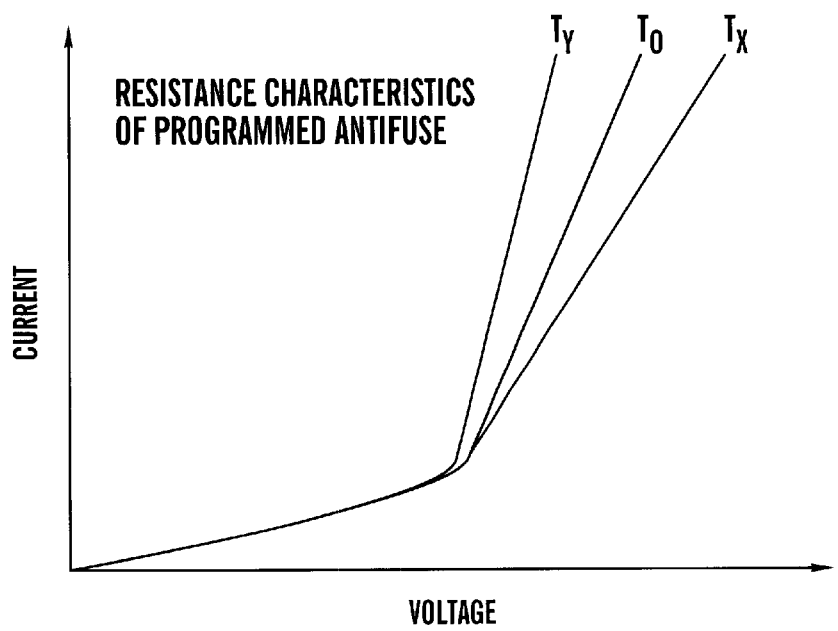
FIG. 3 is a graph showing how the resistance value of a conventional programmed antifuse changes over time.

FIG. 3 shows that the resistance characteristics of a programmed antifuse change over time. This graph has current on the vertical axis and voltage on the horizontal axis. The graph shows that for a particular type of antifuse, the resistance characteristic at time $T_o$ is different than at time $T_y$ and time $T_x$. For example, time $T_y$ might reflect resistance characteristics after 70 hours of use, and time $T_x$ might reflect resistance characteristics after 145 hours of use. FIG. 3 shows that antifuses change their resistance characteristics as they are stressed over time, demonstrating the need for a fuse latch that can provide testing of resistance margins.

Figure 4:
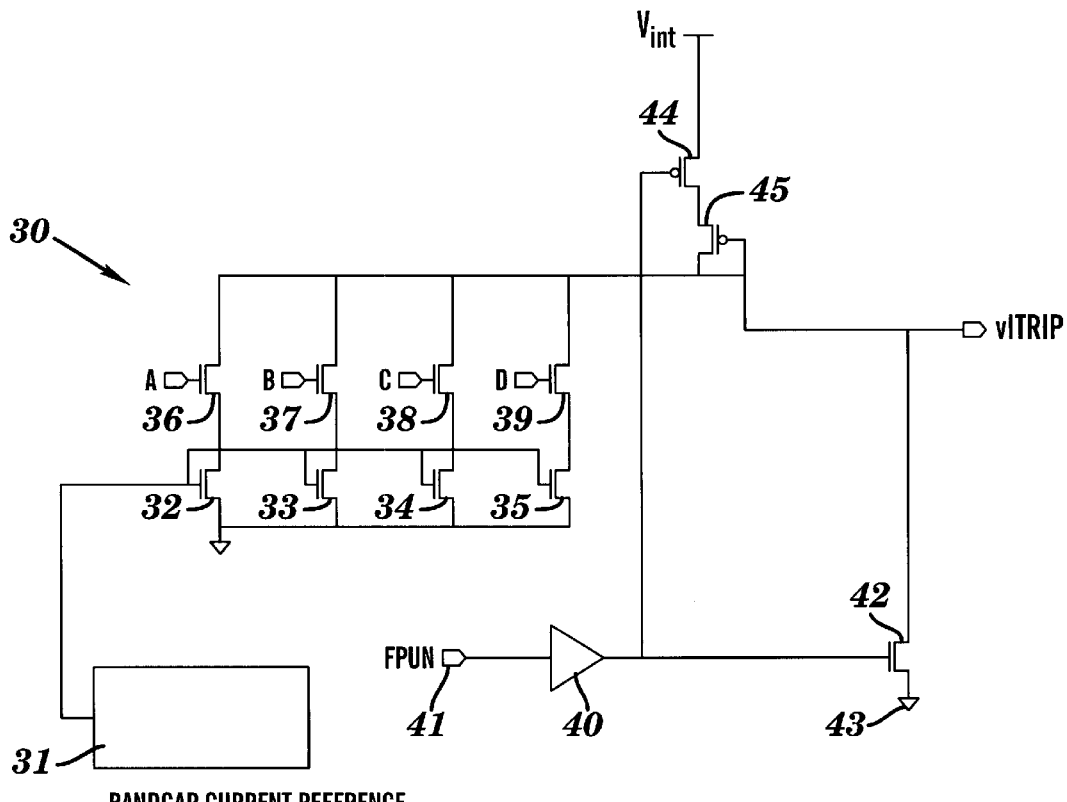
FIG. 4 is a schematic view of a circuit used to generate a trip point current reference for regulating a resistive trip point of a fuse latch.

The circuit of FIG. 4 shows a trip point current reference circuit 30 for developing an adjustable trip point current reference vITRIP in accordance with the present invention. This current reference circuit 30 amplifies and adjusts a current that comes from an on-chip bandgap current reference 31. The bandgap current reference 31 provides a convenient means for obtaining a current reference on a semiconductor, although other means for obtaining the current reference are possible. The bandgap current reference 31 directs a current to a plurality of reference transistors or NFETs 32–35 associated with a plurality of inputs A, B, C and D. The reference transistors 32–35 have their sources connected to ground, their drains connected to input transistors 36–39 associated with the inputs A–D, and their gates connected to the bandgap current reference 31. The first reference transistor 32 connected to the first input transistor 36 has a beta or width of 1. The second reference transistor 33 connected to the second input transistor 37 has a beta or width of 2. The third reference transistor 34 connected to the third input transistor 38 has a beta or width of 4, and the fourth reference transistor 35 connected to the fourth input transistor 39 has a beta or width of 8. The reference values progress binarily from the first reference transistor 32 to the fourth reference transistor 35.

In operation, any combination of the selectable inputs A–D can be selected to change the adjustable trip point current reference vITRIP. In the example shown, the inputs A–D can be selected to provide the possibility of 16 different vITRIP variations. It will be understood by those skilled in the art that a higher or lower number of inputs or combination of inputs can be used to provide more or less vITRIP variations. For example, if input A is selected, the gate of the input transistor 36 associated with input A is activated, and the reference transistor 32 having a beta or width of 1 is connected to the vITRIP node. If a combination of the inputs A–D are selected, the vITRIP node is connected to varying widths or betas. Thus, the strength of the group of reference transistors 32-35 connected to vITRIP can be changed to govern the relative strength of the vITRIP current reference in a binary manner.

The trip point current reference circuit 30 has an inverter 40 with an input 41 connected to the strobe signal input FPUN and an output connected to a gate of a bypass transistor or NFET 42. When the strobe signal input FPUN is active (high), the output of the inverter 40 low. Because the output of the inverter 40 is low, the gate of the bypass NFET 42 blocks current flow from the vITRIP current reference to ground 43. Thus, when the strobe signal input FPUN is active, the bypass NFET 42 remains open and allows a high vITRIP current reference to output from the trip point current reference circuit 30. In contrast, when the strobe signal input FPUN is inactive or low, the output of the inverter 40 is high, and the gate of the bypass NFET 42 allows current flow from the vITRIP current reference to ground 43. Thus, when the strobe signal input FPUN is inactive, the bypass NFET 42 is closed and a low vITRIP current reference is output from the reference circuit 30.

In operation, the vITRIP current reference is kept low or at ground by the bypass NFET 42 when the chip is functioning in a normal mode and the fuse element is not being sensed by the latch circuit (i.e., the strobe signal input FPUN is inactive). As explained below, a low vITRIP current reference will cause a maximum current to go into the latch circuit of the present invention (described below), thereby providing the highest soft error immunity (i.e., immunity from stray radiation or other electrical disturbance). The bypass NFET 42 thus provides an override of the set current reference vITRIP, which causes a maximum amount of current to be forced through the fuse latch circuit during normal operation.

The PFETs 44, 45 in the trip point current reference circuit are connected to form an output diode. The PFET 44 is connected to the power supply Vint, and the other PFET 45 is connected the trip point current reference vITRIP. The reference transistors 32–35 associated with the inputs A–D operate to pull a certain amount of current $I_1$ out of the output diode formed by the PFETs 44 and 45. A certain gate voltage $V_1$ is developed in response to the current $I_1$. The trip point current reference circuit 30 provides a current mirror arrangement that effectively pipes that certain gate voltage $V_1$ to a plurality of latch circuits of an integrated circuit. As a result, when an identical PFET in the latch circuit has that gate voltage $V_1$ applied to its gate, the amount of current flowing through the PFET in the latch circuit will be mirrored proportionally to the current flowing through the output diode in the trip point current reference circuit 30.

Figure 5:
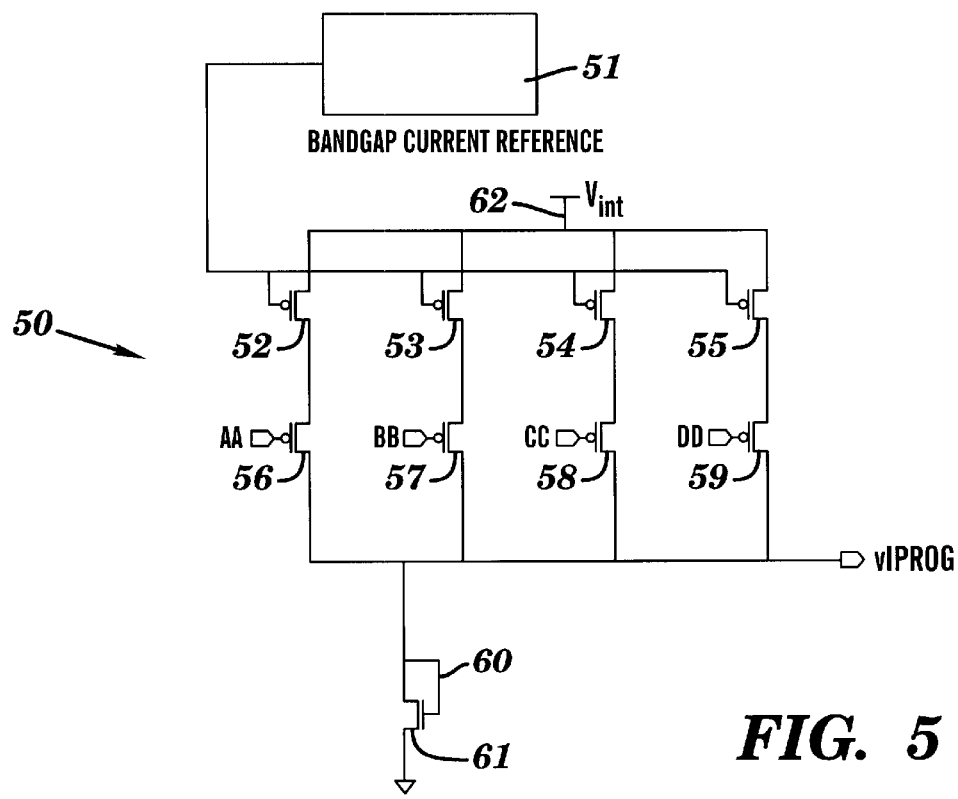
FIG. 5 is a schematic view of a circuit used to generate a programming current reference for regulating a programming current of a fuse latch.

FIG. 5 shows a programming current reference circuit 50 for developing a programming current reference vIPROG. The programming current reference circuit 50 of FIG. 5 is similar in many respects to the trip point current reference circuit 30 of FIG. 4. A bandgap current reference 51 provides a bandgap current to the programming current reference circuit 50. The bandgap current controls the gates of a first group of reference transistors or PFETs 52–55, which operate to gate a certain amount of current through the reference circuit 50. A plurality of inputs AA, BB, CC and DD are associated with a second group of input transistors or PFETs 56–59, each of which is connected to a corresponding one of the PFETs 52–55 of the first group. The input PFETs 56–59 allow current to flow when the inputs AA, BB, CC, and DD are low.

A reference diode 60 is provided in the programming current reference circuit 50 and has an NFET 61 connected to ground. The NFET 61 has its gate connected to its drain to form the reference diode 61. In operation, a certain amount of current $I_2$, depending on the settings of the inputs AA, BB, CC and DD, flows from the voltage source 62 down through the reference diode 60. The programming current reference vIPROG, which is connected to the gate of the reference diode 61, is then output from the circuit 50. As explained in detail below, the amount of programming current used to program a fuse element in the fuse programming circuit of the latch device of the present invention is mirrored based on the programming current reference vIPROG generated by the reference circuit 50. The programming current through the fuse element therefore is proportional to a binary multiple of the current that comes out of the bandgap current reference 51.

The programming current reference vIPROG is used to provide an optimum range of programming current in the latch. This is important because if an antifuse is programmed with too much current, it will program badly and can even damage the surrounding elements of silicon. On the other hand, if the antifuse is programmed with not enough current, the antifuse is not heated up enough or sufficient charge is not delivered, and ineffective programming will result. The optimum range of programming current can change from one technology to another, and may change as the result of manufacturing changes. Therefore, it is useful to have a circuit that will adjust the programming current in a convenient and predictable manner. The current mirror technology used by the reference circuit 50 is highly mathematical and can accurately predict the amount of programming current in the latch device by a selection of the inputs AA–DD.

Figure 6:
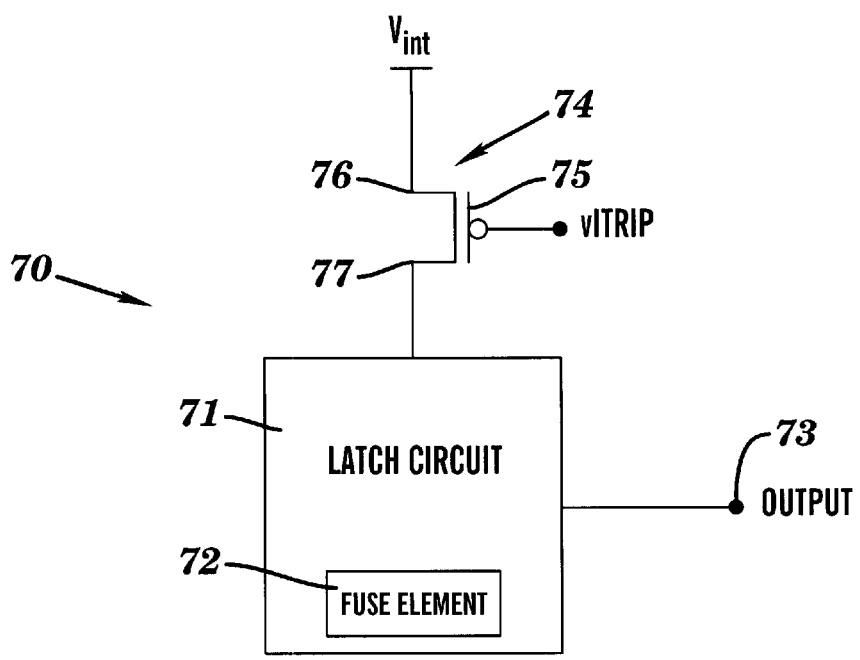
FIG. 6 is a schematic circuit diagram of a fuse latch device having a trip point control element controlled by the trip point current reference.

FIG. 6 shows a first basic feature of the invention in which a latch device 70 is provided having a voltage source Vint, a latch circuit 71 connected to a fuse element 72 and having a fuse latch output 73, and a trip point control element 74. The trip point control element 74 is a PFET having its gate 75 connected to the trip point current reference vITRIP, its source 76 connected to the voltage source Vint, and its drain 77 connected to the latch circuit 71. The PFET 74 operates to adjust an amount of current flowing through the PFET 74 into the latch circuit 71 based on the adjustable trip point current reference vITRIP. In this way, the resistive trip point of the latch device 70 can be adjusted in a controlled and predictable manner. The ability to adjust the resistive trip point of the latch device 70 is particularly useful when the fuse element 72 is an electrically programmed fuse element, such as an antifuse. The adjustable resistive trip point allows testing a resistance margin of the fuse element 72. The adjustable current flow through the latch device 70 can also be used to improve the soft error immunity of the latch device 70 by setting the current flow to its maximum level when the latch device 70 is not being used to sense the state of the fuse element 72.

Figure 7:
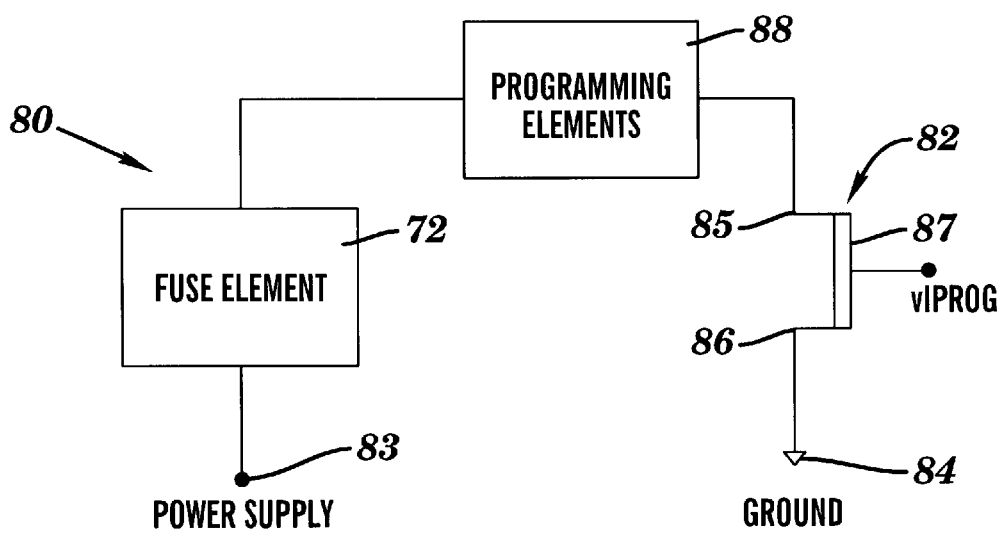
FIG. 7 is a schematic circuit diagram of a fuse element programming circuit having a current control device controlled by the programming current reference.

FIG. 7 shows a second basic feature of the invention in which a fuse element programming circuit 80 is provided having controlled current programming. The programming circuit 80 has a fuse element 72 and a current control device 82 connected to the fuse element 72. The current control device 82 is controlled by the programming current reference vIPROG. The programming current reference vIPROG is developed using the programming current reference circuit 50 shown in FIG. 5, as described above. The fuse element 72 and current control device 82 are placed in a conductive path between a power supply 83 and a second power supply (usually a ground) 84. The current control device 82 operates to limit an amount of programming current passing from the power supply 83 through the fuse element 72.

The current control device 82 is an NFET having a source 85, a drain 86, and a gate 87. The gate 87 is connected to the programming current reference vIPROG. A change in the programming current reference vIPROG changes an amount of current flowing through the NFET 82 and the fuse element 72. The fuse element programming circuit 80 includes other programming elements 88, such as a decoder transistor and a high voltage blocking transistor, which will be further explained below.

Figure 8:
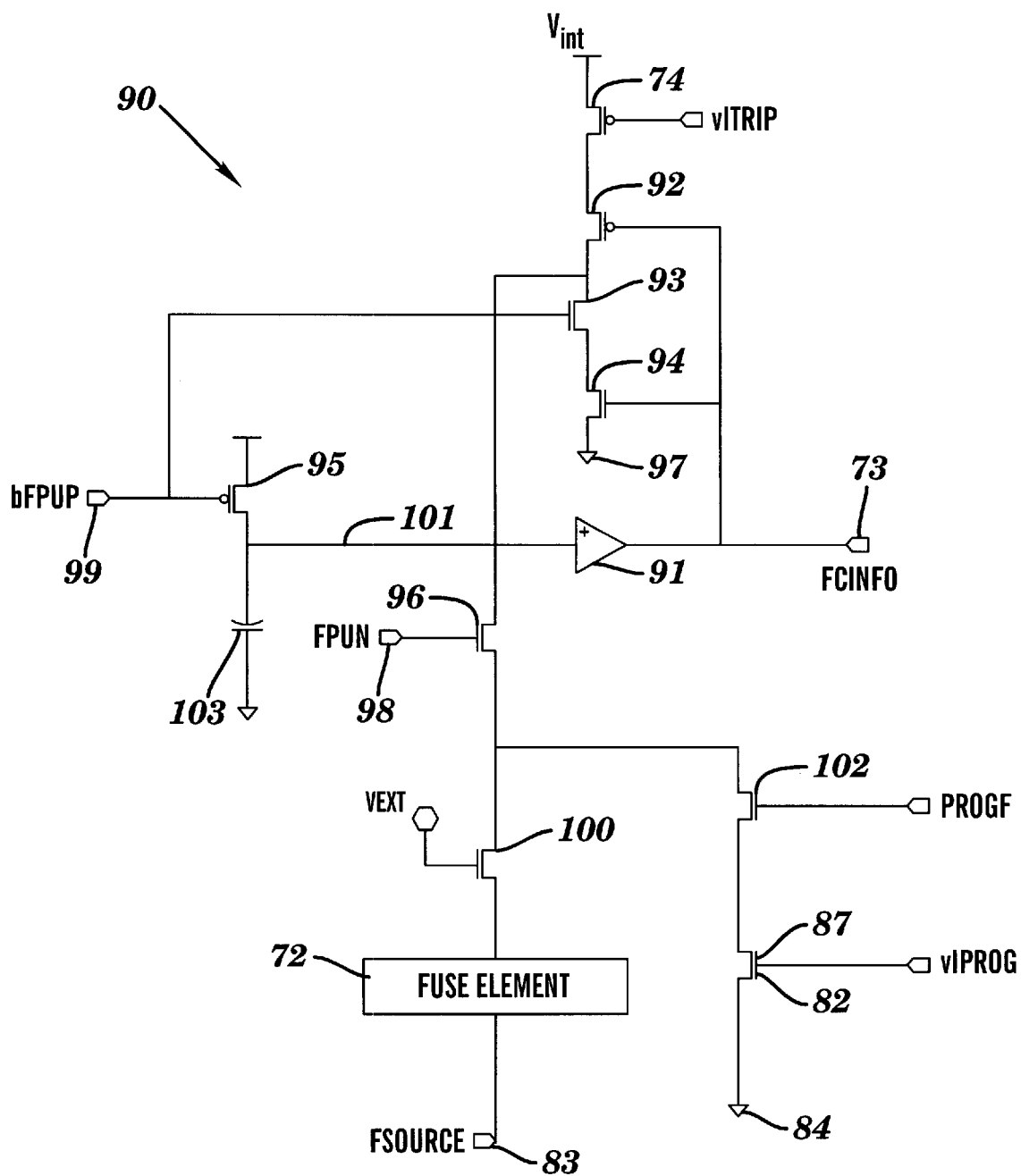
FIG. 8 is a schematic circuit diagram of a fuse latch device having controlled current programming and a variable trip point according to the present invention.

FIG. 8 shows a latch device 90 having both a variable trip point and controlled current programming according to the present invention. That is, the latch device 90 includes the elements of the latch device 70 shown in FIG. 6 and the programming circuit 80 shown in FIG. 7. The same reference numerals are used in FIG. 8 for the elements that correspond to the elements shown in FIGS. 6 and 7. The latch device 90 of FIG. 8 has similarities to the fuse latch 10 shown in FIG. 1, as described above. For example, the inverter 91, PFET 92, NFET 93, NFET 94, PFET 95, NFET 96, ground 97, strobe input (FPUN) 98, precharge input (bFPUP) 99, placement of the fuse element 72, and the fuse latch output (FCINFO) 73 are similar in their arrangement in the latch device 90 as in the fuse latch 10 of FIG. 1.

The latch device 90 shown in FIG. 8 has the trip point control element 74 for controlling the amount of current passing through the latch circuit. The trip point control element 74 is a PFET having its gate connected to the adjustable trip point current reference vITRIP, its source connected to the voltage source Vint, and its drain connected to the source of the PFET 92 of the latch circuit. When the trip point current reference vITRIP is maximum (at 0 volts), the trip point control PFET 74 allows a maximum current to flow into the latch circuit. When the trip point current reference VITRIP is at higher voltages, the trip point control PFET 74 provides a controlled amount of current into the latch circuit based on the particular inputs A–D selected in the trip point current reference circuit 30.

The amount of current passing through the trip point control PFET 74 into the latch circuit from the voltage source Vint is proportional to the resistive trip point of the latch device 90. The current from the voltage source Vint flows through the trip point control PFET 74, down through the PFET 92, down through the NFET 96 and the NFET 100, through the fuse element 72, and to the FSOURCE node 83. The trip point control PFET 74 controls the current that flows through this path precisely.

The voltage node (initc) 101 connected to the input of the inverter 91 has a voltage that varies in response to the amount of current flowing from the voltage source Vint through the latch circuit and the fuse element. For example, the latch device 90 can be designed to trip when the voltage node 101 reaches about one volt. By varying the current flowing through the latch circuit to the fuse element 72 during the sensing mode, the amount of fuse resistance required to generate one volt on the voltage node 101 can be varied accordingly. Hence, the latch device 90 can be provided with an adjustable trip point. That is, the sensitivity of the latch device 90 can be adjusted so that it will trip at various fuse resistance values.

Figure 9:
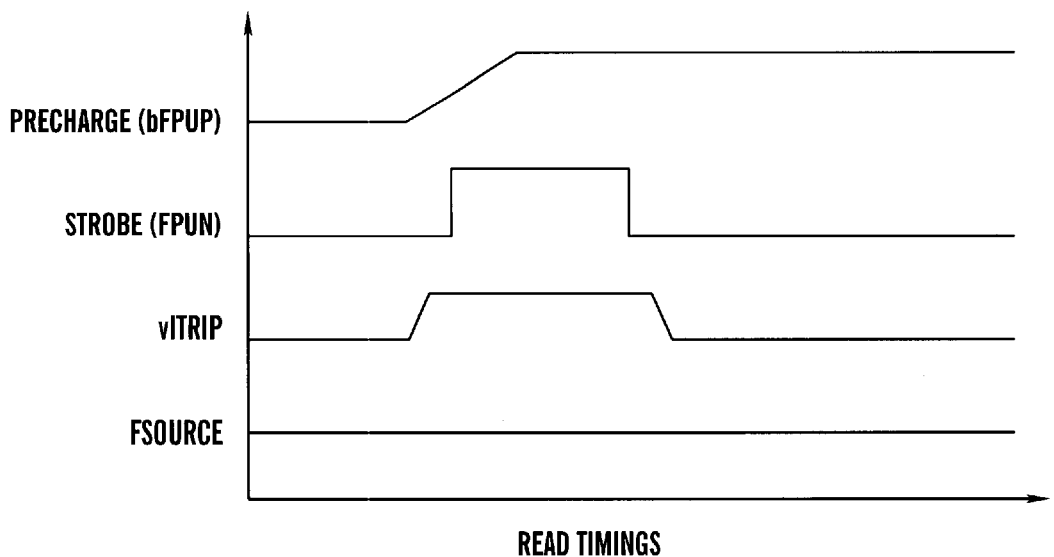
FIGS. 9 and 10 are voltage timing diagrams of a read operation and a programming operation, respectively, of the antifuse latch device of the present invention.

To sense whether a fuse element 72 is programmed or unprogrammed, the latch device 90 of FIG. 8 operates according to the timing sequence shown in FIG. 9. First, the precharge input bFPUP starts low and then goes high. During this transition, the strobe input FPUN is turned on allowing a short burst of current to charge up the fuse elements. By overlapping the precharge input bFPUP pulse and the strobe input FPUN pulse, the fuse latch circuit will start at a high state and eliminate any charge sharing problems. The precharge input bFPUP remains high (i.e., off), but the strobe input FPUN has a short duration and then returns low. The trip point current reference vITRIP goes to a predetermined voltage state when a pulse is applied at the strobe input FPUN. The predetermined state of the trip point current reference VITRIP causes the trip point control PFET 74 to reduce the amount of current flowing from the voltage source Vint into the latch circuit, thereby placing the latch device 90 in a more sensitive condition able to differentiate between programmed and unprogrammed resistance values. The FSOURCE input 83 remains in an inactive state (i.e., at ground) during the read operation.

If the fuse element 72 is intact as a closed circuit, it will drain that precharge off of the voltage node 101. On the other hand, if the fuse element 72 has a high resistance value, the amount of charge on the voltage node 101 remains above the latch trip point, and the latch state is unchanged. Once the fuse latch device 90 is set and established, the strobe input FPUN goes back to ground (i.e., its inactive state), and the latch is set and stable for its normal operation. The latch device 90 of FIG. 8 can thus be used to read or poll a fuse element 72 to see if it is programmed or unprogrammed. The latch device 90 reads the fuse element 72, stores the logical state in the fuse latch, and then provides that output through the fuse latch output (FCINFO) 73 for use elsewhere in an electronic circuit.

A first part of the latch device 90 of FIG. 8 for reading the fuse element 72 has been described above. A second part of the latch device 90 for programming the fuse element 72 will now be described. The second part of the latch device 90 corresponds to the fuse element programming circuit 80 shown in FIG. 7. A programming loop is formed from the FSOURCE node 83 of the latch device up through the fuse element 72, through the NFET 100, and then back down through the decoder transistor 102 and the current control transistor 82, and then to ground 84. The fuse element 72 is programmed by varying amounts of current from the FSOURCE 83 passing through the fuse element 72 in the programming loop. The amount of current passing through the programming loop is determined by the programming current reference vIPROG, which is generated by the programming current reference circuit 50 shown in FIG. 5. The programming current reference vIPROG is input to the gate 87 of the current control transistor 82, which is an NFET, and the source and drain of the current control transistor are placed in the programming loop between the power supply FSOURCE 83 and the ground 84. Thus, the flow of programming current from the source to the drain in the current control transistor 82 corresponds to the current flow through the fuse element 72 and is controlled by the voltage level of the programming current reference vIPROG.

The binary states of the four inputs AA–DD of the programming current reference circuit 50 determine the strength of the programming current reference vIPROG, and hence, the amount of voltage applied to the gate 87 of the current control transistor 82. Using current mirror technology, the amount of current that will go through the programming loop in response to the digital selection of inputs AA–DD can be controlled and predicted easily.

Figure 10:
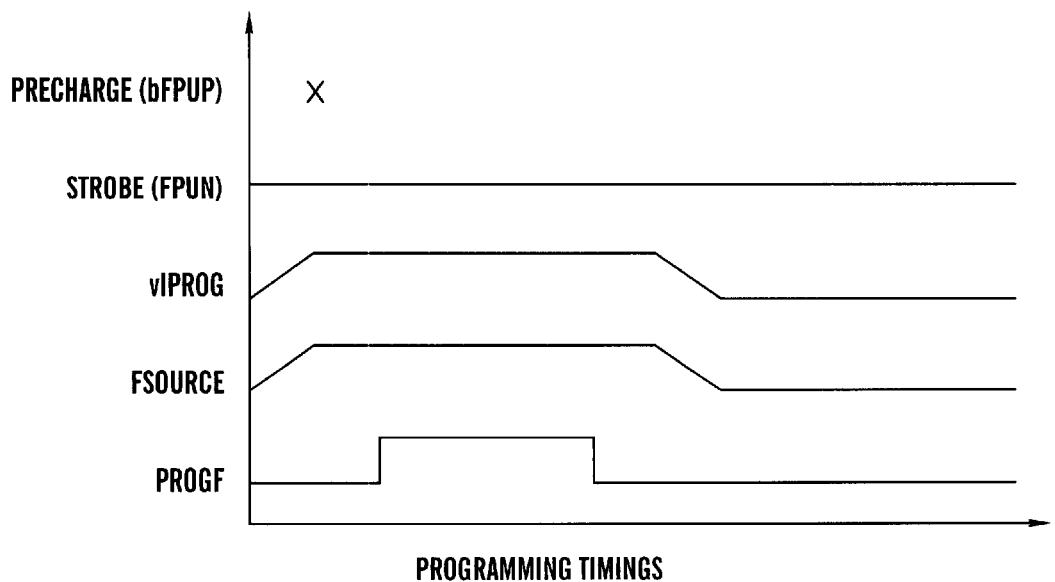

To program the fuse element 72, as indicated in the timing diagram of FIG. 10, the programming current reference vIPROG goes up to some value, the power supply input FSOURCE goes up to some voltage value, and the programming current input PROGF is pulsed high for a short duration and then returned low. At this point, the fuse element is programmed and the FSOURCE and programming current reference vIPROG can be shut off. The strobe input FPUN is not used during programming and will remain low. The precharge input bFPUP can be high or low and also is not used in the programming operation.

The programming current reference vIPROG and the FSOURCE input, respectively, can be connected in parallel to all of the latches in a bank of fuse elements, so that these inputs are uniform across the bank of fuse elements. The programming inputs PROGF to the programming transistors 102 for each fuse latch 90 are individually controlled to determine which fuse elements 72 in the bank of fuse elements are programmed. For example, the programming inputs PROGF are pulsed high for those fuse elements to be programmed, and remain low for those fuse elements that are not to be programmed. A fuse element 72 will only be programmed by the programming circuit when all three controlling inputs vIPROG, PROGF and FSOURCE are active. In a bank of fuse elements that all received an active FSOURCE input and an active vIPROG input, only those fuse elements 72 that have an active PROGF input are actually programmed. Thus, the present invention provides an effective means for parallel fuse programming.

The NFET 100 is a high voltage blocking transistor and has another power supply Vext connected to its gate, which is a higher voltage than the voltage source Vint. The NFET 100 functions to prevent the high programming voltage coming from the power supply FSOURCE from damaging anything. A capacitor 103 is connected to the voltage node 101 of the inverter 91. The capacitance provided by the capacitor 103 to the voltage node 101 makes the latch device 90 more immune from soft error events, such as from stray radiation or other electrical disturbances.

Figure 11:
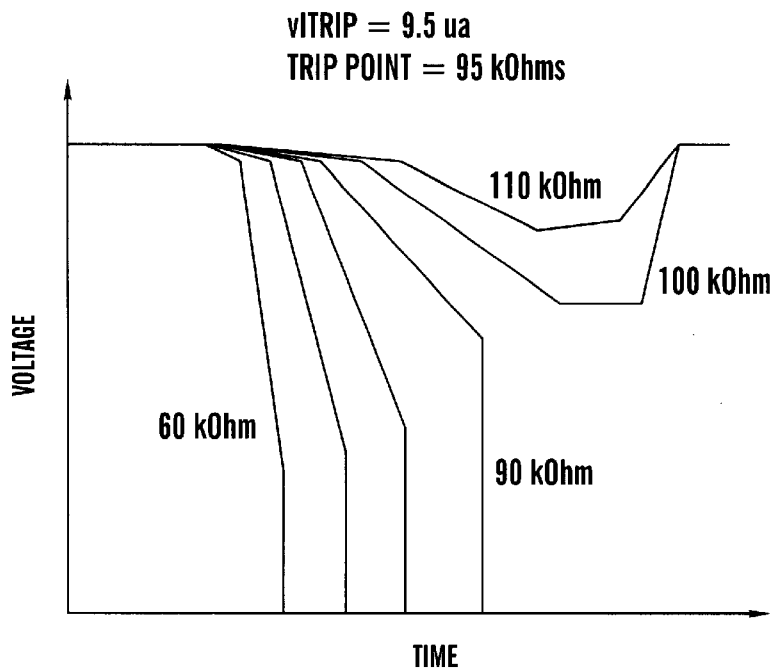
FIGS. 11 and 12 are graphs of circuit analysis results showing that the trip point during a read of the fuse latch of the present invention can be varied in a predictable manner by changing the input current to the latch circuit.
Figure 12:
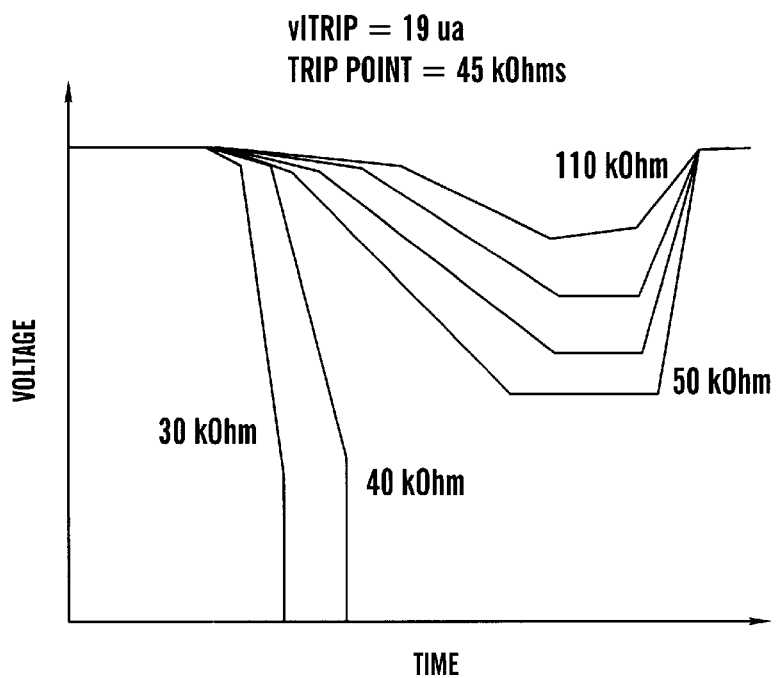

FIGS. 11 and 12 show the results of a circuit analysis program which indicates that the resistive trip point of the fuse latch 90 can be changed in a linear fashion by changing the current reference vITRIP. In FIG. 11, the current reference vITRIP was set to 9.5 micro amps, and the circuit analysis determined a resistive trip point of the latch device 90 of approximately 95 kOhms. In FIG. 12, the current reference vITRIP was set to 19 micro amps, and the circuit analysis determined a resistive trip point of the latch device 90 of approximately 45 kOhms.

The lines on the graphs of FIGS. 11 and 12 show what happens to the voltage on the latch node 101. If the line begins to pull down and then snaps down to the bottom of the graph to 0 volts, the latch has been tripped. As the resistance changes between 90 and 100 kOhms in FIG. 11 (vITRIP=9.5 micro amps), it can be seen that the latch has changed its state, thereby indicating an approximate resistive trip point of the latch of 95 kOhms. Similarly, as the resistance changes between 40 and 50 kOhms in FIG. 12 (VITRIP=19 micro amps), it can be seen that the latch has changed its state, thereby indicating an approximate resistive trip point of the latch of 45 kOhms. The graphs of FIGS. 11 and 12 demonstrate that the resistive trip point of the latch device 90 can be varied linearly and predictably by varying the current reference vITRIP.

Figure 13:
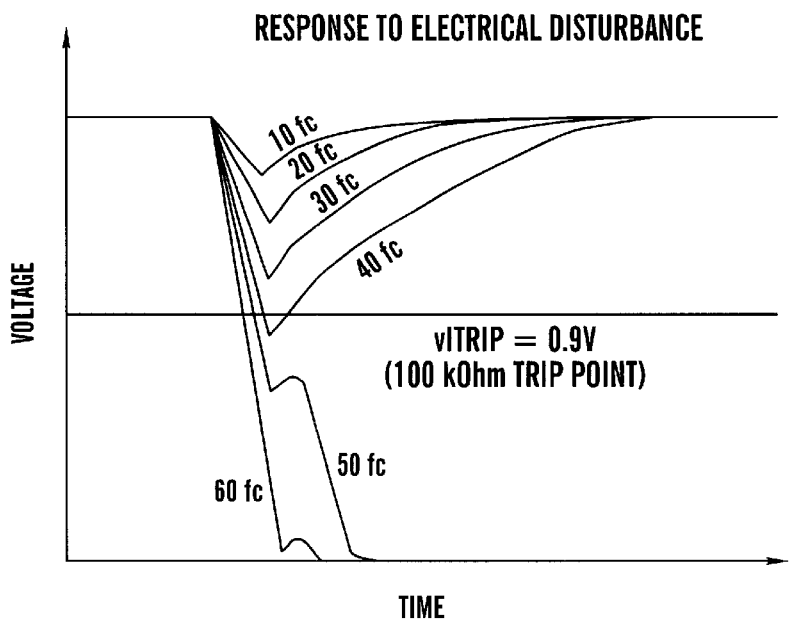
FIGS. 13 and 14 are graphs of circuit analysis results showing that the latch device becomes more immune to electrical disturbances as the current flow is increased through the fuse latch of the present invention.
Figure 14:
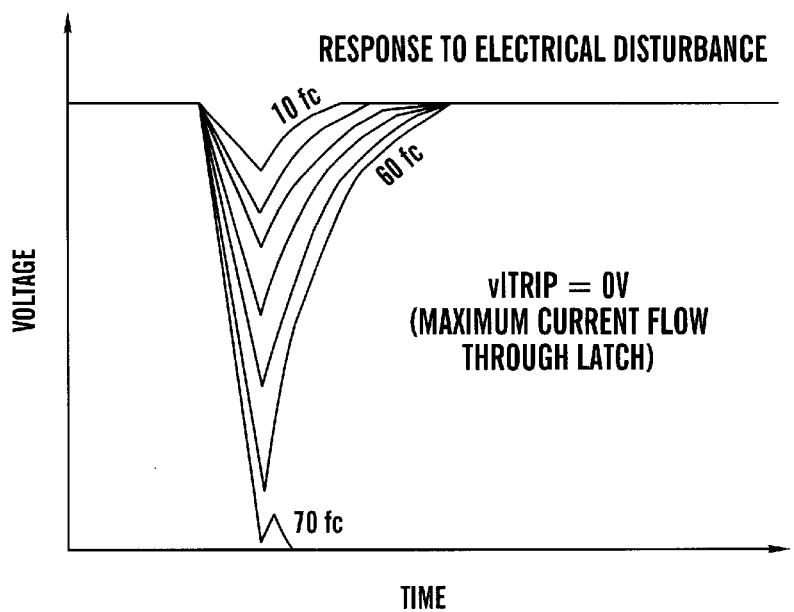

FIGS. 13 and 14 show the results of a circuit analysis program which indicates that a soft error immunity of the latch device 90 can be improved by increasing the current flowing through the latch device. FIG. 13 shows the results of the circuit analysis with the trip point current reference vITRIP set to a value (e.g., 0.9V) that corresponds to a resistive trip point of the fuse latch device 90 of 100 kOhms. FIG. 14 shows the results of the circuit analysis with the trip point current reference vITRIP set to zero, which causes a maximum current to flow from the voltage source Vint into the fuse latch device 90.

The circuit analysis shown in FIG. 13 indicates a failure point of the circuit at an electrical disturbance of approximately 45fc (where "fc" refers to femto coulombs or $10^{-15}$ coulombs). On the other hand, the circuit analysis shown in FIG. 14 indicates a failure point of the circuit at an electrical disturbance of approximately 65fc. Thus, FIGS. 13 and 14 demonstrate that the soft error immunity (i.e., the stability) of the latch device 90 can be improved by forcing a maximum current flow into the latch circuit (i.e., by setting the trip point current reference vITRIP to 0, which increases the current flow through the trip point control PFET 74). The electrical disturbance might be caused by atomic particles, cosmic rays, and various other types of high energy particles that strike and pass through the silicon chip. A latch device that is in a very sensitive condition may have its voltage changed enough to cause the latch to change its output state as a result of the electrical disturbance.

The present invention provides a means of taking the latch device 90 out of its most sensitive condition after the state of the fuse element 72 has been sensed. The latch device 90 is only vulnerable to soft error failure for a small time during the latch sensing (e.g., hundredths of milliseconds). The latch device 90 is taken out of its most sensitive state by forcing a maximum amount of current into the latch device through the trip point control PFET 74. The latch device 90 will then remain in this less vulnerable state for as long as it is powered on, or until the fuse latch is recycled.

Figure 15:
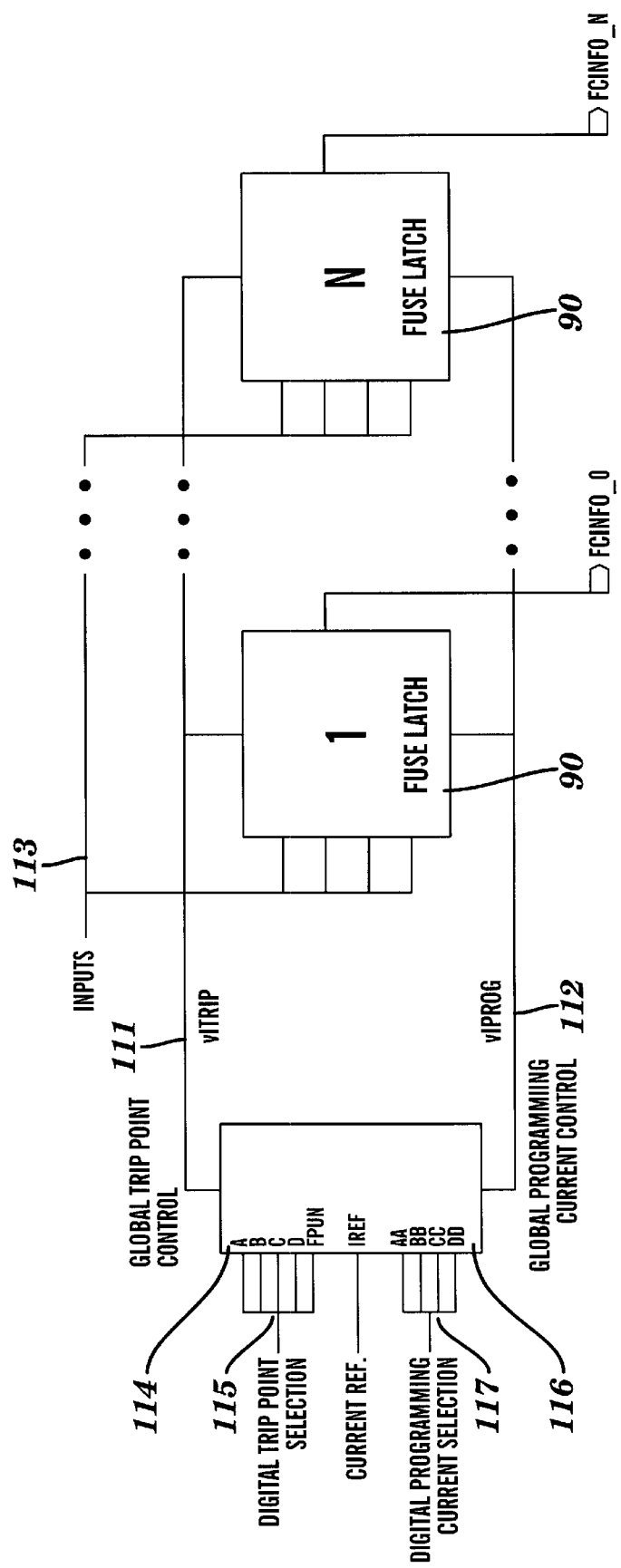
FIG. 15 is a schematic diagram of a bank of fuse latches having a global trip point control and a global programming current control connected to the fuse latches in parallel to control the resistive trip point and the programming current of the fuse latches uniformly.

FIG. 15 shows a bank of fuse elements 110 having several latch devices 90 according to the present invention connected in parallel. Each latch device 90 is connected in parallel to a common wire 111 inputting the trip point current reference vITRIP and another common wire 112 inputting the programming current reference vIPROG. Each latch device 90 also has specific inputs 113 that govern, for example, whether the fuse element 72 is to be programmed or unprogrammed. The trip point current reference vITRIP is generated by a global trip point control circuit 114 based on a digital trip point selection input 115. The programming current reference vIPROG is generated by a global programming current control circuit 116 based on a digital programming current selection input 117. These global circuits 114 and 116 correspond to the reference circuits 30 and 50 shown in FIGS. 4 and 5, respectively.

The integrated circuit of FIG. 15 shows that the trip point current reference vITRIP and programming current reference vIPROG can be reused and plugged into as many fuse latch devices 90 in the bank of fuse elements 110 as desired. Thus, a single trip point current reference vITRIP can be used to control the trip points of a plurality of latch devices 90, and a single programming current reference vIPROG can be used to control the programming current that flows through a plurality of latch devices 90. By using a global trip point control circuit 114 and a global programming current control circuit 116 for several fuse latch devices 90 connected together in parallel, an efficient means of controlling programming currents and resistive trip points of the latch devices 90 is provided.

The embodiments and examples set forth herein were presented in order to best explain the present invention and its practical application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed. Many modifications and variations are possible in light of the above teachings without departing from the spirit and scope of the following claims.

What is claimed is:

1. A latch device having a variable resistive trip point, comprising:
    a voltage source;
    an adjustable trip point current reference;
    a latch circuit having a fuse latch output; and
    a trip point control element, said trip point control element being operable to control the amount of current passing through said latch circuit based on said adjustable trip point current reference, thereby providing the latch device with a variable resistive trip point.

2. The latch device as set forth in claim 1, wherein said trip point control element is a transistor, and wherein a gate of said transistor is connected to said adjustable trip point current reference.

3. The latch device as set forth in claim 2, wherein said transistor has a source connected to said voltage source and a drain connected to said latch circuit, wherein a change in said adjustable trip point current reference changes an amount of current flowing through said transistor into said latch circuit.

4. The latch device as set forth in claim 3, wherein said transistor is an FET.

5. The latch device as set forth in claim 1, wherein said latch circuit is connected to a fuse element.

6. The latch device as set forth in claim 5, wherein said fuse element is an antifuse.

7. The latch device as set forth in claim 1, wherein said adjustable trip point current reference is adjustable binarily.

8. The latch device as set forth in claim 1, further comprising a trip point current reference circuit for developing said adjustable trip point current reference, said trip point current reference circuit having a plurality of selectable inputs for changing the adjustable trip point current reference.

9. The latch device as set forth in claim 8, wherein said plurality of inputs are connected to binarily weighted reference transistors which are operable to change the adjustable trip point current reference binarily.

10. The latch device as set forth in claim 1, further comprising a trip point current reference circuit for developing said adjustable trip point current reference using a current mirror control.

11. The latch device as set forth in claim 1, wherein said latch circuit has a polling transistor comprising a source, a drain and a gate, the gate being connected to a strobe signal input, said polling transistor being operable to poll a fuse connected to the latch circuit when the strobe signal input is in an active state.

12. The latch device as set forth in claim 11, further comprising a trip point current reference circuit for developing said adjustable trip point current reference, and wherein said strobe signal input is connected to a bypass transistor in said trip point current reference circuit to adjust said adjustable trip point current reference to a state in which said trip point control element allows a maximum amount of current to pass from said voltage source into said latch circuit when said strobe signal input is in its inactive state.

13. The latch device as set forth in claim 1, further comprising a trip point current reference circuit for developing said adjustable trip point current reference, said trip point current reference circuit comprising a bandgap current reference.

14. The latch device as set forth in claim 1, wherein said trip point control element is operable to provide the latch device with at least a first trip point for testing a resistance margin of a fuse element, a second trip point for improving soft error immunity, and a third trip point for normal operation.

15. The latch device as set forth in claim 1, further comprising:
    a fuse element connected to said latch circuit; and
    a programming circuit connected to said fuse element, said programming circuit having a current control element for adjusting an amount of programming current passing through said fuse element, said current control element being controlled by an adjustable current reference.

16. An integrated circuit comprising:
    a global trip point control circuit that provides an adjustable trip point current reference; and
    a plurality of fuse latch devices, each fuse latch device comprising a latch circuit having a fuse latch output and a trip point control element, said trip point control elements being connected in parallel to said adjustable trip point current reference and being operable to control an amount of current passing through each of said latch circuits based on said adjustable trip point current reference.

17. The integrated circuit as set forth in claim 16, wherein said global trip point control circuit comprises a plurality of selectable inputs which are operable to change the adjustable trip point current reference binarily.

18. The integrated circuit as set forth in claim 16, further comprising:

a global programming current control circuit that provides an adjustable programming current reference; and each fuse latch device having a fuse element and a programming current control device, said programming current control devices being connected in parallel to said adjustable programming current reference and being operable to control an amount of programming current passing through each of said fuse elements based on said adjustable programming current reference.

19. The integrated circuit as set forth in claim 18, wherein said global programming current control circuit comprises a plurality of selectable inputs which are operable to change the adjustable programming current reference binarily.

* * * * *